(12) United States Patent
Cok

(10) Patent No.: US 7,834,541 B2
(45) Date of Patent: Nov. 16, 2010

(54) OLED DEVICE HAVING IMPROVED LIGHT OUTPUT

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 747 days.

(21) Appl. No.: 11/538,966

(22) Filed: Oct. 5, 2006

(65) Prior Publication Data
US 2008/0084150 A1     Apr. 10, 2008

(51) Int. Cl.
H01L 51/00     (2006.01)
(52) U.S. Cl. .................. 313/504; 313/506; 313/110
(58) Field of Classification Search .................. 313/504, 313/506, 110, 512
See application file for complete search history.

(56) References Cited

U.S. PATENT DOCUMENTS

| | | | |
|---|---|---|---|
| 4,476,292 A | 10/1984 | Ham et al. | |
| 4,769,292 A | 9/1988 | Tang et al. | |
| 5,247,190 A | 9/1993 | Friend et al. | |
| 5,955,837 A | 9/1999 | Horikx et al. | |
| 2004/0212296 A1 | 10/2004 | Nakamura et al. | |
| 2004/0252933 A1 | 12/2004 | Sylvester et al. | |
| 2005/0007000 A1 | 1/2005 | Chou et al. | |
| 2005/0012076 A1 | 1/2005 | Morioka | |
| 2005/0194896 A1* | 9/2005 | Sugita et al. | 313/506 |
| 2005/0275615 A1 | 12/2005 | Kahen et al. | |
| 2006/0186802 A1 | 8/2006 | Cok et al. | |

OTHER PUBLICATIONS

C. W. Tang et al; "Organic Electroluminescent Diodes"; Applied Physics Letter; vol. 51; No. 12; Sep. 21, 1987; pp. 913-915.
C. W. Tang et al; "Electroluminescence Of Doped Organic Thin Films"; Journal of Applied Physics; vol. 65; No. 9; May 1, 1989; pp. 3610-3616.
Ronald S. Cok et al; "Light-Scattering Color-Conversion Material Layer"; U.S. Appl. No. 11/361,094; filed Feb. 24, 2006.

* cited by examiner

Primary Examiner—Karabi Guharay
(74) Attorney, Agent, or Firm—McKenna Long & Aldridge LLP

(57) ABSTRACT

An organic light-emitting diode (OLED) device, comprising: a light-emitting area of an OLED comprising a first electrode, a second transparent electrode, and one or more layers of organic light-emitting material formed between the electrodes; and a light-scattering layer, formed on a side of the transparent electrode opposite the one or more layers of organic light-emitting material, comprising transparent, light-scattering particles, wherein the ratio of the volume of light-scattering particles to the volume of the layer is greater than 0.55 over a majority of the light-emitting area.

19 Claims, 6 Drawing Sheets

OLED DEVICE HAVING IMPROVED LIGHT OUTPUT

FIELD OF THE INVENTION

The present invention relates to organic light-emitting diode (OLED) devices, and more particularly, to OLED device structures having a light-scattering layer for improving light output.

BACKGROUND OF THE INVENTION

Organic light-emitting diodes (OLEDs) are a promising technology for flat-panel displays and area illumination lamps. The technology relies upon thin-film layers of materials coated upon a substrate. However, as is well known, much of the light output from the light-emissive layer in the OLED is absorbed within the device. Because light is emitted in all directions from the internal layers of the OLED, some of the light is emitted directly from the device, and some is emitted into the device and is either reflected back out or is absorbed, and some of the light is emitted laterally and trapped and absorbed by the various layers comprising the device. In general, up to 80% of the light may be lost in this manner.

OLED devices generally can have two formats known as small molecule devices such as disclosed in U.S. Pat. No. 4,476,292 and polymer OLED devices such as disclosed in U.S. Pat. No. 5,247,190. Either type of OLED device may include, in sequence, an anode, an organic EL element, and a cathode. The organic EL element disposed between the anode and the cathode commonly includes an organic hole-transporting layer (HTL), an emissive layer (EL) and an organic electron-transporting layer (ETL). Holes and electrons recombine and emit light in the EL layer. Tang et al. (Appl. Phys. Lett., 51, 913 (1987), Journal of Applied Physics, 65, 3610 (1989), and U.S. Pat. No. 4,769,292) demonstrated highly efficient OLEDs using such a layer structure. Since then, numerous OLEDs with alternative layer structures, including polymeric materials, have been disclosed and device performance has been improved.

Light is generated in an OLED device when electrons and holes that are injected from the cathode and anode, respectively, flow through the electron transport layer and the hole transport layer and recombine in the emissive layer. Many factors determine the efficiency of this light generating process. For example, the selection of anode and cathode materials can determine how efficiently the electrons and holes are injected into the device; the selection of ETL and HTL can determine how efficiently the electrons and holes are transported in the device, and the selection of EL can determine how efficiently the electrons and holes be recombined and result in the emission of light, etc. It has been found, however, that one of the key factors that limits the efficiency of OLED devices is the inefficiency in extracting the photons generated by the electron-hole recombination out of the OLED devices. Due to the high optical indices of the organic materials used, most of the photons generated by the recombination process are actually trapped in the devices due to total internal reflection. These trapped photons never leave the OLED devices and make no contribution to the light output from these devices.

A typical OLED device uses a glass substrate, a transparent conducting anode such as indium-tin-oxide (ITO), a stack of organic layers, and a reflective cathode layer. Light generated from the device is emitted through the glass substrate. This is commonly referred to as a bottom-emitting device. Alternatively, a device can include a substrate, a reflective anode, a stack of organic layers, and a top transparent cathode layer. Light generated from the device is emitted through the top transparent electrode. This is commonly referred to as a top-emitting device. In these typical devices, the index of the ITO layer, the organic layers, and the glass is about 2.0, 1.7, and 1.5 respectively. It has been estimated that nearly 60% of the generated light is trapped by internal reflection in the ITO/organic EL element, 20% is trapped in the glass substrate, and only about 20% of the generated light is actually emitted from the device and performs useful functions.

Referring to FIG. 8, an OLED device as proposed in the prior art is illustrated having a substrate 10 (either reflective, transparent, or opaque), a reflective first electrode 12, one or more layers 14 of organic material, one of which is light-emitting, a transparent second electrode 16, a gap 18 and an encapsulating cover 20. The encapsulating cover 20 is transparent and may be coated directly over the transparent electrode 16 so that no gap 18 exists. It has been proposed to fill the gap with polymeric or desiccating material. Such polymers and desiccants typically will have indices of refraction greater than or equal to that of the substrate 10 or encapsulating cover 20, and it is generally proposed to employ materials having indices of refraction matched to that of the encapsulating cover to reduce interlayer reflections. Light emitted from one of the organic material layers 14 can be emitted directly out of the device, through the encapsulating cover 20, as illustrated with light ray 1. Light may also be emitted and internally guided in the encapsulating cover 20 and organic layers 14, as illustrated with light ray 2. Additionally, light may be emitted and internally guided in the layers 14 of organic material and transparent electrode 16, as illustrated with light ray 3. Light rays 4 emitted toward the reflective first electrode 12 are reflected by the reflective first electrode 12 toward the cover 20 and follow one of the light ray paths 1, 2, or 3. In some prior-art embodiments, the first electrode 12 may be opaque and/or light absorbing. In an alternative prior-art device, light is emitted through the substrate and light is trapped therein rather than in the cover. In this case, substrate 10 and electrode 12 are transparent and electrode 16 may be reflective.

A variety of techniques have been proposed to improve the out-coupling of light from thin-film light emitting devices. Such techniques include the use of diffraction gratings, brightness enhancement films having diffractive properties, reflective structures, and surface and volume diffusers. The use of micro-cavity techniques is also known. However, none of these approaches cause all, or nearly all, of the light produced to be emitted from the device. Moreover, diffractive techniques cause a significant frequency dependence on the angle of emission so that the color of the light emitted from the device changes with the viewer's perspective. Scattering techniques are also known and described in, for example, US 2006/0186802 entitled "OLED device having improved light output" by Cok which is hereby incorporated in its entirety by reference.

It is also known to combine layers having color-conversion materials with scattering particles to enhance the performance of the color-conversion materials by increasing the likelihood that incident light will interact with the color-conversion materials, thereby reducing the concentration or thickness of the layer. Such combination may also prevent light emitted by the color-conversion material from being trapped in the color-conversion material layer. US20050275615 A1 entitled "Display device using vertical cavity laser arrays" describes such a layer as does US20040252933 entitled "Light Distribution Apparatus".

US20050012076 entitled "Fluorescent member, and illumination device and display device including the same" teaches the use of color-conversion materials as scattering particles. US20040212296 teaches the use of scattering particles in a color-conversion material layer to avoid trapping the frequency-converted light. Co-pending, commonly assigned U.S. Ser. No. 11/361,094, filed Feb. 24, 2006, entitled "Light-Scattering Color-Conversion Material Layer" by Cok which is hereby incorporated in its entirety by reference describes integral light-scattering color-conversion material layers.

US20050007000 A1 entitled "Brightness and contrast enhancement of direct view emissive displays" describes emissive displays including a plurality of independently operable light emitters that emit light through one or more transmissive layers. The emissive displays further include elements disposed between the light emitters and the transmissive layers to frustrate total internal reflections that can occur at one or more of the interfaces created by the transmissive layers, such as at an interface between the light emitter and a transmissive layer or at an interface between a transmissive layer and air. By frustrating total internal reflections, the brightness of the emissive display can be enhanced. Elements for frustrating total internal reflections include volume diffusers, surface diffusers, microstructures, and combinations of these or other suitable elements.

As taught in the prior art, classic scattering theory employs arrays of spheres. If such spheres are arranged adjacent to each other to form a layer, the ratio of the volume of the spheres ($V_p=(4*\pi*r^3)/3$) divided by the volume of the layer ($V_L=(2*r)^3$) is equal to $\pi/6$ or 0.5236. U.S. Pat. No. 5,955,837 entitled "Electroluminescent illumination system with an active layer of a medium having light-scattering properties for flat-panel display devices" describes the use of a half-monolayer of scattering particles on the substrate of a bottom-emitting electro-luminescent device. The volume ratio of such a layer is at most one half of a classical mono-layer array of contacting spheres, or approximately 0.26. While optimizing the combination of extraction of light trapped in the substrate and non-scattering of non-trapped light for the disclosed devices, such a material layer may not scatter light trapped in the organic and electrode layers, and is difficult to form. Moreover, as the amount of trapped light relative to the amount of emitted light increases, the relative amount of desirable scattering increases so that the described half-monolayer of scattering particles may not optimally extract all of the emitted light from OLED devices of interest. It is also true that the organic electro-luminescent materials, reflective electrodes, and transparent electrodes all absorb some light. Hence, it can be desirable to scatter trapped high-angle light as soon as possible to minimize absorption. Additionally, experiments performed by applicant have shown that such volume ratios of a practical scattering layer does not extract light optimally for some OLED device structures.

There is a need therefore for an improved organic light-emitting diode device structure and scattering layer that further improves the efficiency of the device.

SUMMARY OF THE INVENTION

In accordance with one embodiment, the invention is directed towards an organic light-emitting diode (OLED) device, comprising: a light-emitting area of an OLED comprising a first electrode, a second transparent electrode, and one or more layers of organic light-emitting material formed between the electrodes; and a light-scattering layer, formed on a side of the transparent electrode opposite the one or more layers of organic light-emitting material, comprising transparent, light-scattering particles, wherein the ratio of the volume of light-scattering particles to the volume of the layer is greater than 0.55 over a majority of the light-emitting area.

In accordance with a further embodiment, the invention is directed towards a method of forming an OLED device comprising the steps of: a) providing an OLED with a light-emitting area comprising a first electrode and a second transparent electrode and one or more layers of organic light-emitting material formed between the electrodes; b) forming a dispersion comprising an evaporable solvent and a plurality of transparent light scattering particles; c) coating the dispersion on a side of the transparent electrode opposite the one or more layers of organic light-emitting material; and d) drying the dispersion to form a light scattering layer on the transparent electrode, wherein the average ratio of the volume of scattering particles to the volume of the layer is greater than 0.55 over a majority of the light-emitting area.

Advantages

The present invention has the advantage that it increases the light output from an OLED device and reduces manufacturing costs.

It will be understood that the figures are not to scale since the individual layers are too thin and the thickness differences of various layers too great to permit depiction to scale.

DETAILED DESCRIPTION OF THE INVENTION

Figure 1:
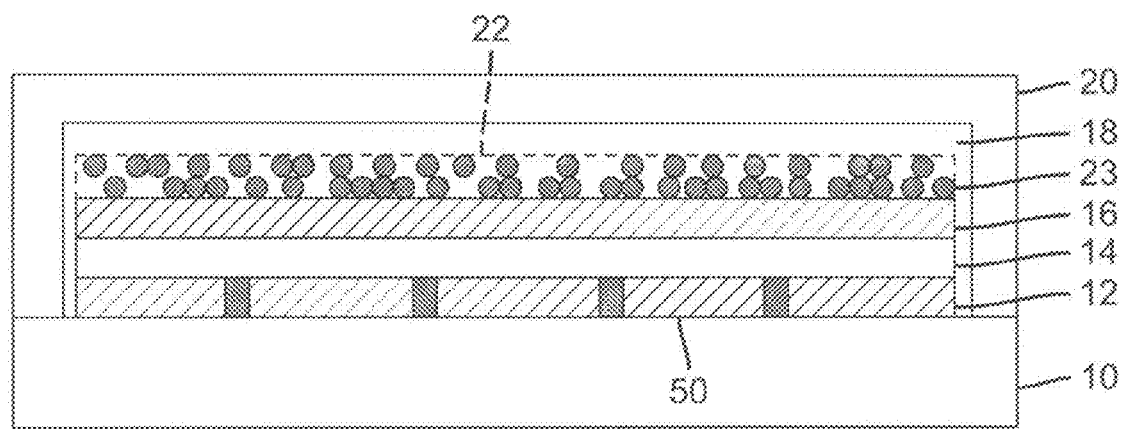
FIG. 1 is a cross section of an OLED having a light-scattering layer according to an embodiment of the present invention.

Referring to FIG. 1, in accordance with one embodiment of the present invention, an organic light-emitting diode (OLED) device comprises an OLED having a first electrode 12, a second transparent electrode 16, one or more layers of organic light-emitting material 14 formed between the electrodes 12 and 16. Light-emitting areas of the device are defined where the first electrode 12, second transparent electrode 16, and the one or more layers of organic light-emitting material 14 are aligned. A light-scattering layer 22 is formed on a side of the transparent electrode 16 opposite the one or more layers of organic light-emitting material 14, comprising transparent, light-scattering particles 23, wherein the ratio of the volume of light-scattering particles 23 to the volume of the layer 22 is greater than 0.55 over a majority of a light-emitting area. Preferably, the ratio is between 0.55 and 0.75, and more preferably is between 0.55 and 0.65. The OLED may be formed on a substrate 10 with a cover 20 adhered to the substrate forming a gap 18 between the OLED and the inside of the cover 20.

In various embodiments of the present invention, the light-scattering particles 23 may have a relatively higher index of refraction than the average index of the remaining volume of the light-scattering layer 22. That is, the scattering particles 23 may be located in a relatively lower-index binder or formed on a surface (e.g. transparent electrode 16) in a vacuum or gas-filled cavity, such as cavity 18 of FIG. 1. In another embodiment of the present invention, the light-scattering particles are non-spherical and randomly oriented. Such particle shapes and orientations effectively form a random scattering structure that scatters all light at every point on the surface of the transparent electrode 16 thereby increasing the amount of high-angle trapped light that may be scattered at each encounter with the scattering layer 22. Such a randomizing effect reduces angular dependence for color and luminance of the emitted light, a useful property for most light-emitting devices such as displays and area illuminators, but may not be found in prior-art sparse, low-volume ratio scattering layers. In further preferred embodiments of the present invention, in order to minimize the amount of trapped light that cannot be extracted, no layers having an index of more than 0.1 less than that of the light-emitting material layer and a thickness sufficient to trap light are formed between the scattering layer 22 and the light emitting material layer 14. Even more preferably, the light-scattering layer 22 is in direct optical contact with the light-emitting material layer 14. By direct optical contact is meant that any layers formed between the scattering layer 22 and the light emitting material layer 14 have an index equal to or greater than that of the light-emitting material layer or a thickness insufficient to trap light. In either instance, transparent protective layers may be employed between the scattering layer 22 and the transparent electrode 16.

The volume of the layer is the volume enclosed by the surface below the light-scattering particles and on which the light-scattering particles are formed and in contact with and a parallel surface above, and in contact with, the light-scattering particles, and surfaces orthogonal to the top and bottom surfaces on each edge. For a device having a rigid, planar substrate, the volume is the volume of the smallest rectangular solid that can enclose all of the light-scattering particles in the layer. The present invention may be employed in a pixilated display device having patterned electrodes and light-emitting areas 50. In such a device, the light-scattering layer may be formed over each light-emitting area, either individually or in one contiguous coating. In either case, the volume of the layer encloses only those light-scattering particles located above or below the light-emitting area 50. In accordance with the invention, the ratio of the volume of light-scattering particles 23 to the volume of the layer 22 is greater than 0.55 over at least a majority of a light-emitting area. While the ratio may preferably be greater than 0.55 over the entire light-emitting area of the device, it may also be preferable include relative large projecting particles not intended for light scattering in the light-scattering layer over minor portions of the light emitting area (e.g., as spacer particles as taught in copending U.S. Ser. No. 11/179,409, filed Jul. 12, 2005, the disclosure of which is incorporated herein by reference). As such larger particles would otherwise dramatically increase the volume of a layer defined by the peaks of the projecting particles without significantly affecting the light-scattering, areas including such relatively large particles need not be included when determining the volume ratio of scattering particles in the scattering layer of the invention. Accordingly, the present invention only requires that the volume ratio be greater than 0.55 over a majority of a light-emitting area. Hence, any areas coated with such larger particles may be excluded from the delineation of the volume-defining surface of the scattering layer.

According to the present invention, the light-scattering particles may comprise a variety of materials, as may the remainder of the volume not occupied by the light-scattering particles. In a preferred embodiment of the present invention, the majority of the remaining volume may be a gas or vacuum. Preferably, air or an inert gas is employed.

The light-scattering particles of the present invention preferably have an optical refractive index greater than or equal to the optical refractive index of the light-emitting material layer 14 and/or the transparent electrode 16. Such an optically refractive index effectively extracts light from the device since it may prevent any light from being trapped in the light-emitting material layer 14 and/or the transparent electrode 16. In practice, the light-scattering particles may have an optical refractive index greater than or equal to 1.8.

Figure 2:
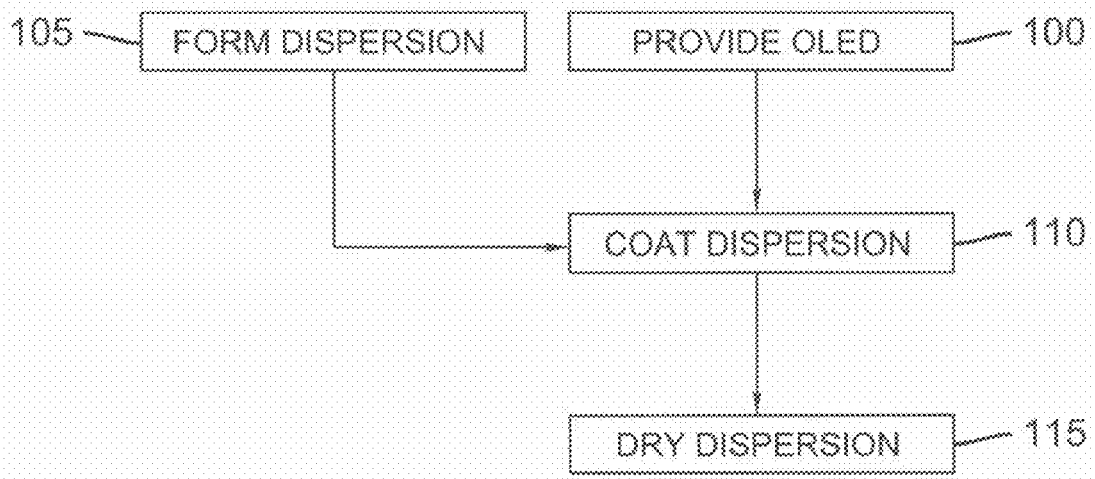
FIG. 2 is a flow diagram illustrating a method of making the present invention.

Referring to FIG. 2, in accordance with the present invention, the OLED device incorporating a light-scattering layer may be formed by providing 100 an OLED with a light-emitting area comprising a first electrode and a second transparent electrode and one or more layers of organic light-emitting material formed between the electrodes; forming 105 a dispersion comprising an evaporable solvent and a plurality of transparent light scattering particles; coating 110 dispersion on a side of the transparent electrode opposite the one or more layers of organic light-emitting material; and drying 115 the dispersion to form a light scattering layer on the transparent electrode, wherein the ratio of the volume of scattering particles to the volume of the layer is greater than 0.55 over at least a majority of a light-emitting area. Techniques for forming OLED devices are well known in the art.

Figure 3:
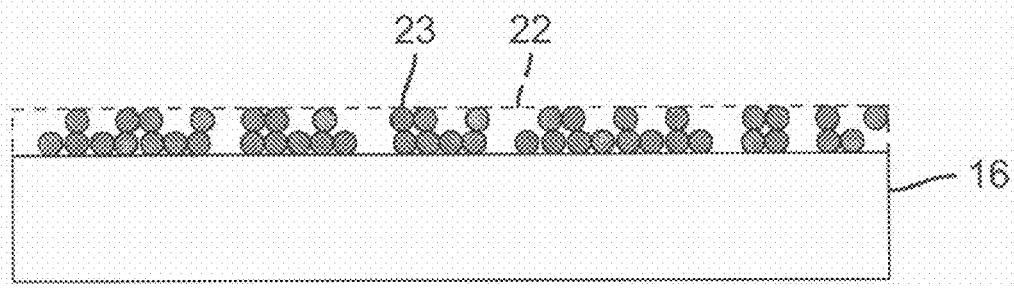
FIG. 3 is a cross section of a light-scattering layer according to an alternative embodiment of the present invention.

Additional materials may be included in the dispersion to further enhance the method or the effectiveness of the resulting layer. For example, surfactants or binders, may be employed. In particular, a binder having a refractive optical index less than the refractive index of the light-scattering particles and having a weight less than 10% of the weight of the light-scattering particles may be employed. Such binders, for example comprising urethane, have been demonstrated by the Applicant to effectively act as both a surfactant and a means to adhere the light-scattering particles to an electrode. Referring to FIG. 3, a dried layer 22 of light-scattering particles 23 are formed on the transparent electrode 16.

Figure 4:
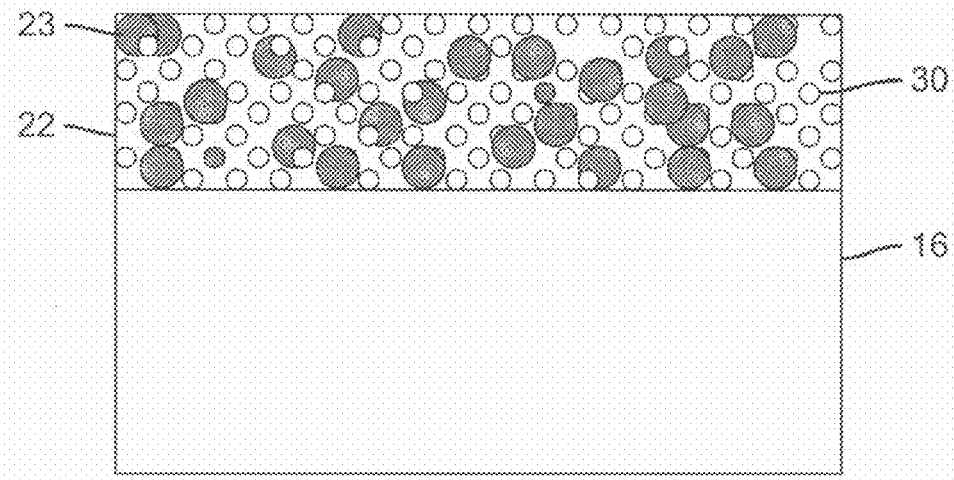
FIG. 4 is a cross section of a light-scattering layer according to an alternative embodiment of the present invention.

Referring to FIG. 4, in an alternative embodiment of the present invention, a binder may be added to a dispersion comprising light-scattering particles and an admixture of transparent, high-index, nano-particles 30 to form a high-optical-index layer formed over transparent electrode 16. In this case, the binder and nano-particles 30 may form a smooth, planar layer adjacent to transparent electrode 16. Applicant has formed such high-index nano-particles to form transparent high-index layers. The high-index nano-particles may not scatter light but may enhance the optical coupling between the light-scattering particles 23 and the transparent electrode 16. It is preferred that the nano-particles 30 have an optical index different from that of the light-scattering particles 23.

Figure 5:
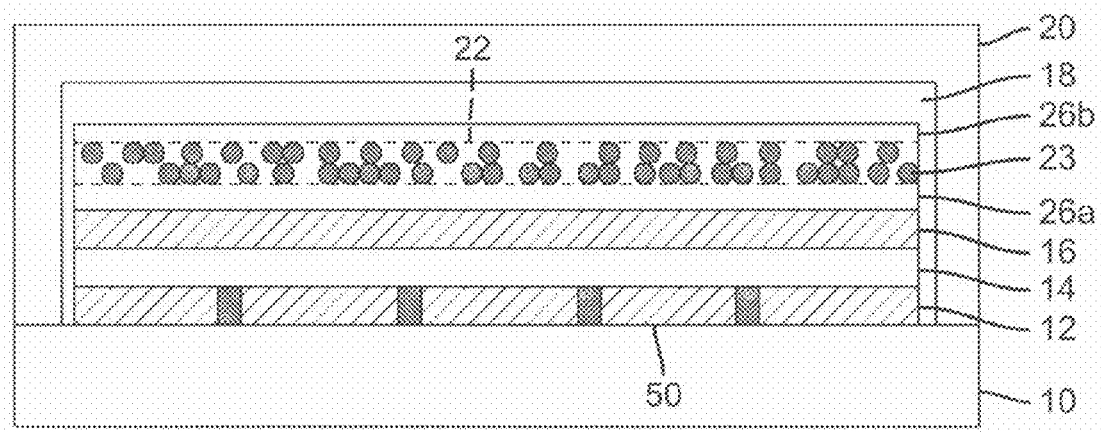
FIG. 5 is a cross section of an OLED having a light-scattering layer according to an alternative embodiment of the present invention.

As shown in FIG. 1, the light-scattering layer 22 may be adjacent to and in contact with the second transparent electrode 16. Such a configuration can place the light-scattering layer 22 in optical contact with the second transparent electrode 16 thereby enhancing the transmission of light from the second transparent electrode 16 to the light-scattering layer 22. In further embodiments of the present invention, as shown in FIG. 5, one or more protective layers 26a/26b may be formed between the light-scattering layer 22 (26a) and the second transparent electrode 16 and/or over the light-scattering layer 22 (26b) on the side of the light-scattering layer 16 opposite the second transparent electrode. Protective layers, for example metal oxides such as aluminum oxide or zinc oxide and parylene, are known in the art. When employed, the index of such protective layers preferably may be greater than 0.1 less than that of the light-emitting material layer (more preferably at least that of the light-emitting material layer) and have a thickness insufficient to trap light emitted from the light emitting material layer. In a further embodiment of the present invention, a low-index layer, as taught in US 2006/0186802 may be employed in or as the gap 18 and the OLED device may be a top-emitting display device and the first electrode 12 may be a reflective electrode.

In preferred embodiments, the encapsulating cover 20 and substrate 10 may comprise glass or plastic with typical refractive indices of between 1.4 and 1.6. The transparent low-index element 18 may comprise a solid layer of optically transparent material, a void, or a gap. Voids or gaps may be a vacuum or filled with an optically transparent gas or liquid material. For example air, nitrogen, helium, or argon all have a refractive index of between 1.0 and 1.1 and may be employed. Lower index solids which may be employed include fluorocarbon or MgF, each having indices less than 1.4. Any gas employed is preferably inert. Reflective electrode 12 is preferably made of metal (for example aluminum, silver, or magnesium) or metal alloys. Transparent electrode 16 is preferably made of transparent conductive materials, for example indium tin oxide (ITO) or other metal oxides. The organic material layers 14 may comprise organic materials known in the art, for example, hole-injection, hole-transport, light-emitting, electron-injection, and/or electron-transport layers. Such organic material layers are well known in the OLED art. The organic material layers typically have a refractive index of between 1.6 and 1.9, while indium tin oxide has a refractive index of approximately 1.8-2.1. Hence, the various layers 16 and 14 in the OLED have a refractive index range of 1.6 to 2.1. Of course, the refractive indices of various materials may be dependent on the wavelength of light passing through them, so the refractive index values cited here for these materials are only approximate. In any case, the transparent low-index element 18 preferably has a refractive index at least 0.1 lower than that of each of the first refractive index range and the second refractive index at the desired wavelength for the OLED emitter.

The light-scattering particles 23 may comprise a metal oxide, for example titanium dioxide. In one embodiment, the light-scattering particles have an average maximum diameter of less than 2 microns and in an alternative embodiment, the light-scattering particles have an average maximum diameter of between one and two 2 microns. The light-scattering layer 22 may comprise additional materials, for example phosphorescent or fluorescent particles may be employed to convert light of a higher frequency, for example blue, to a lower frequency, for example red to provide light emission of a desired color when the light-emitting layer 14 emits light of a different, higher-frequency color than is desired. In this case, the phosphorescent or fluorescent particles may have an average diameter less than or equal to 400 nm, less than 100 nm, or less than 10 nm. Such phosphorescent or fluorescent particles are known in the prior art, for example as quantum dots. Alternatively, the light-scattering particles 23 themselves may be phosphorescent or fluorescent particles and serve to both extract trapped light, and to convert relatively high frequency light to a different, lower-frequency color. Relatively lower frequency light that is not converted may simply be extracted. In such a case, the phosphorescent or fluorescent light-scattering particles may be one to two microns in diameter.

In operation, a current is provided by the electrodes 12 and 16 through the organic layer 14 to emit light. Some of the light is usefully emitted through the scattering layer 22 out of the device. Other light may be trapped due to total internal reflection and the high optical indices of the transparent electrode 16 and the organic layer 14. This trapped light may interact with the light-scattering particles 23 in the light-scattering layer 22 and be usefully redirected out of the device, thereby increasing the brightness of the device. If a phosphorescent or fluorescent material is employed in light-scattering layer 22, the emitted light may be converted to a preferred color.

Figure 6:
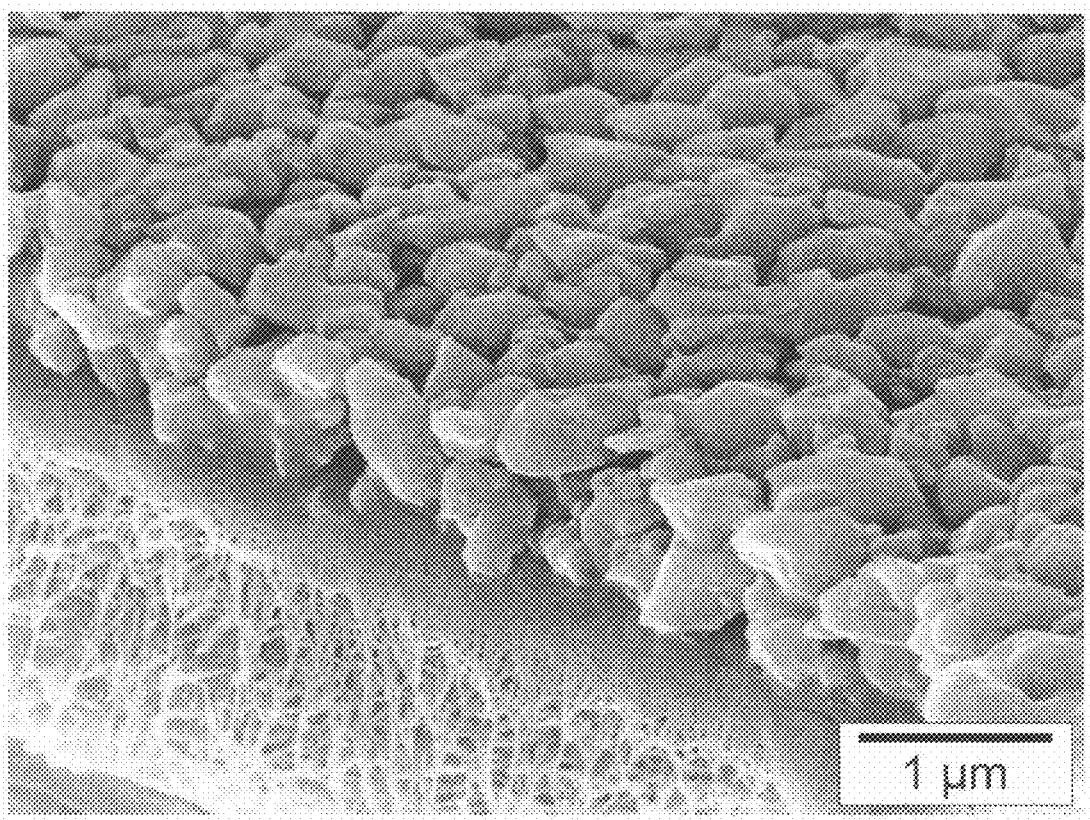
FIGS. 6 and 7 are photo-micrographs of a light-scattering layer according to an embodiment of the present invention.
Figure 7:
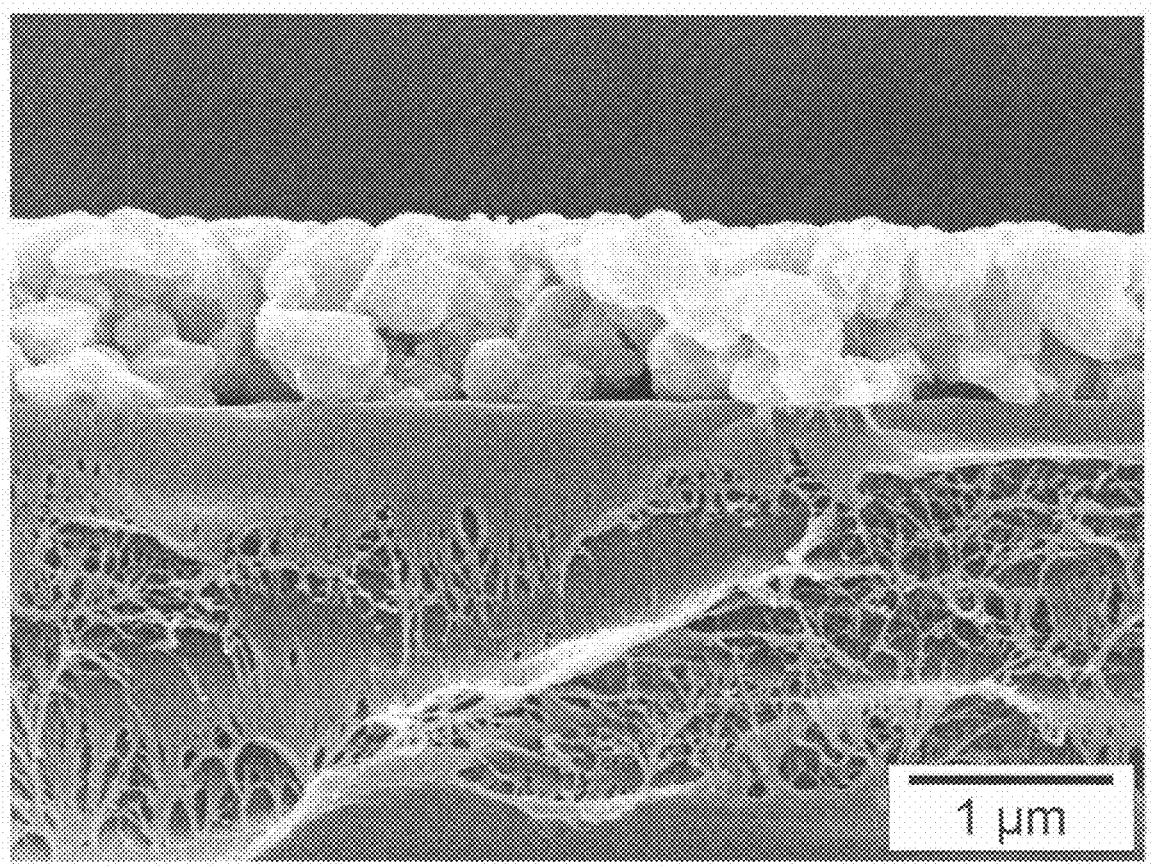
Figure 8:
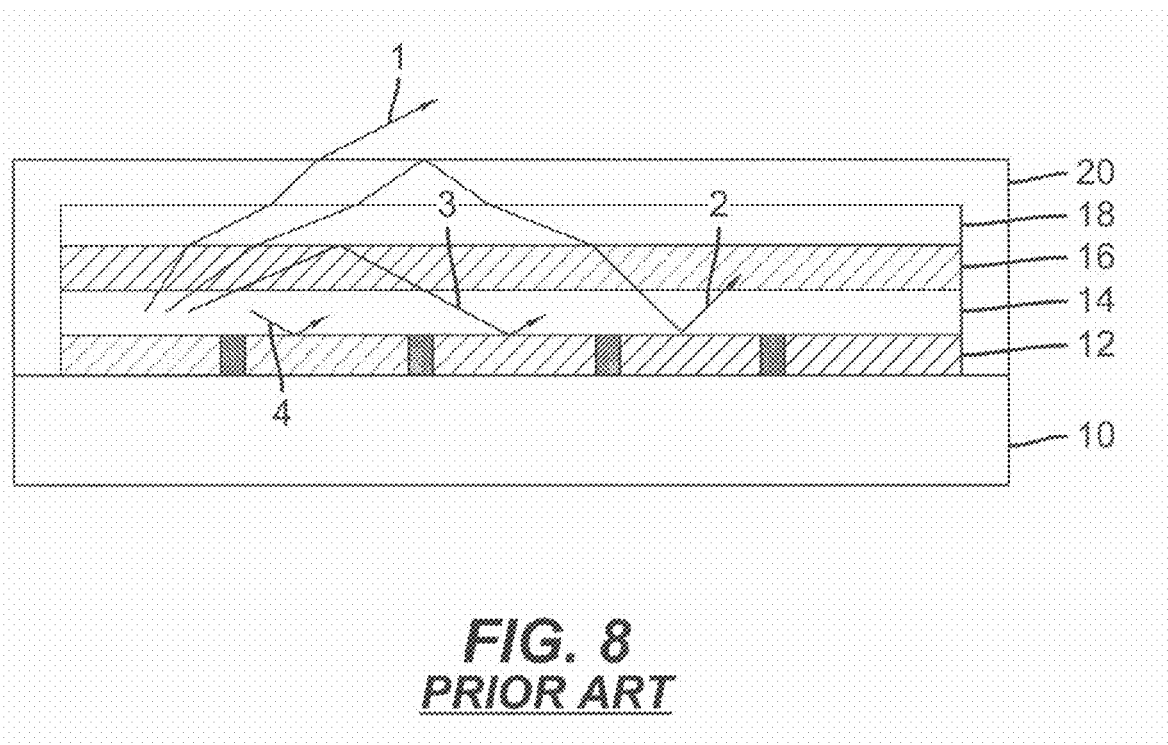
FIG. 8 is a prior-art cross section of an OLED device illustrating light trapping.

Applicants have constructed such a device. FIGS. 6 and 7 are a photomicrograph of a light-scattering layer having $TiO_2$ light-scattering particles according to an embodiment of the present invention having a volume ratio of approximate 0.6. The light-scattering layer comprises 1-2 micron $TiO_2$ particles with a 10% by weight resin surfactant and binder (Solsperse 2000 manufactured by Avecia) and has a thickness of less than one micron. The layer was coated from xylene dispersion in a concentration of 14% by weight, deposited by inkjet employing 60 pL drops deposited at 100 drops/s at a 70 micrometer spacing on the surface of a top-emitting OLED device to form a thin wet film, which was dried at 50 C. Other solvents, including toluene, and coating methods, such as spin coating and spray coating, may alternatively be employed, along with drying temperature variation, to provide a different drying rates. Different densities of particles in solvent were also deposited at different rates and then dried at different temperatures (either in a controlled temperature atmosphere or by heating the substrate on which the dispersion is deposited), thus providing variable drying rates for given quantities of light-scattering materials. In particular, the drying can be controlled to provide different densities of the final light-scattering layers. Applicants demonstrated that temperatures outside a preferred range of from 40-60 C typically resulted in sub-optimal packing densities of less than 0.55 volume percent and did not optimally extract light from the OLED device. Moreover, the rate of deposition (for example, drops per second from an inkjet deposition system) for a constant volume of scattering particles in a dispersion over a surface area affects the drying and the packing structure of the dried layer. The light-scattering layer having the preferred volume ratio was provided over the transparent electrode of an OLED device and the performance of the light-scattering layer were found to have the preferred performance.

The scattering layer 22 can employ a variety of materials. For example, randomly located spheres of titanium dioxide may be employed in a matrix of polymeric material. Alternatively, a more structured arrangement employing ITO, silicon oxides, or silicon nitrides may be used. Shapes of refractive elements may be cylindrical, rectangular, rutile, or spherical, but it is understood that the shape is not limited thereto. The difference in refractive indices between materials in the scattering layer 22 may be, for example, from 0.3 to 3, and a large difference is generally desired. The thickness of the scattering layer, or size of features in, or on the surface of, a scattering layer may be, for example, 0.03 to 50 μm although a thickness of less than one micron may be preferred to minimize absorption and maximize compatibility with other elements of a display device. It is generally preferred to avoid diffractive effects in the scattering layer. Such effects may be avoided, for example, by locating features randomly or by ensuring that the sizes, shapes or distribution of the refractive elements vary and/or are not the same as the wavelength of the color of light emitted by the device from the light-emitting area.

Materials of the light scattering layer 22 can include organic materials (for example polymers or electrically conductive polymers) or inorganic materials. The organic materials may include, e.g., one or more of polythiophene, PEDOT, PET, or PEN. The inorganic materials may include, e.g., one or more of $SiO_x$ (x>1), $SiN_x$ (x>1), $Si_3N_4$, $TiO_2$, MgO, ZnO, $Al_2O_3$, $SnO_2$, $In_2O_3$, $MgF_2$, hafnia ($HfO_2$), zirconia ($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ("YAG", $Y_3Al_5O_{12}$) calcite ($CaCO_3$), sapphire ($Al_2O_3$), diamond, magnesium oxide, and/or germanium oxide, and $CaF_2$. The scattering layer 22 may comprise, for example, silicon oxides and silicon nitrides having a refractive index of 1.6 to 1.8 and doped with titanium dioxide having a refractive index of 2.5 to 3. Polymeric materials having refractive indices in the range of 1.4 to 1.6 may be employed having a dispersion of refractive elements of material with a higher refractive index, for example titanium dioxide.

According to various embodiments of the present invention, the light-scattering layer 22 may comprise a phosphorescent or fluorescent material which is capable of absorbing a portion of the EM radiation at a higher frequency emitted by the organic material layer 14 and re-emitting the light at a lower frequency. Thus, inclusion of such a phosphorescent or fluorescent material can provide a color tuning light emitted from the OELD. Many micrometer-sized particles of oxide materials, such as zirconia, yttrium and rare-earth garnets, and halophosphates, disperse well in standard silicone polymers, such as poly(dimethylsiloxanes) by simple stirring. If necessary, other dispersant materials (such as a surfactant or a polymeric material like poly(vinyl alcohol)) may be added such as are used to suspend many standard phosphors in solution. The phosphor particles may be prepared from larger pieces of phosphor material by any grinding or pulverization method, such as ball milling using zirconia-toughened balls or jet milling. They also may be prepared by crystal growth from solution, and their size may be controlled by terminating the crystal growth at an appropriate time. The preferred phosphor materials efficiently absorb EM radiation emitted by organic layer 14 and re-emit light in another spectral region. Such a combination of organic material electro-luminescence and phosphorescence allows for a flexibility in tuning the color of light emitted by the device. A particular phosphor material or a mixture of phosphors may be chosen to emit a desired color or a range of color to complement the color emitted by organic layer 14 and that emitted by the phosphorescent materials. An exemplary phosphor is the cerium-doped yttrium aluminum oxide $Y_3Al_5O_{12}$ garnet ("YAG:Ce"). Other suitable phosphors are based on YAG doped with more than one type of rare earth ions, such as $(Y_{1-x-y}Gd_xCe_y)_3 Al_5O_{12}$ ("YAG:Gd,Ce"), $(Y_{1-x}Ce_x)_3 (Al_{1-y}Ga_y)O_{12}$ ("YAG:Ga,Ce"), $(Y_{1-x-y}Gd_xCe_y) (Al_{5-z}Ga_z)O_{12}$ ("YAG:Gd,Ga,Ce"), and $(Gd_{1-x}Ce_x)Sc_2Al_3 O_{12}$ ("GSAG") where $0 \leq x \leq 1$, $0 \leq y \leq 1$, $0 \leq z \leq 5$ and $x+y \leq 1$. For example, the YAG:Gd,Ce phosphor shows an absorption of light in the wavelength range from about 390 nm to about 530 nm (i.e., the blue-green spectral region) and an emission of light in the wavelength range from about 490 nm to about 700 nm (i.e., the green-to-red spectral region). Related phosphors include $Lu_3Al_5O_{12}$ and $Tb_2Al_5O_{12}$, both doped with cerium. In addition, these cerium-doped garnet phosphors may also be additionally doped with small amounts of Pr (such as about 0.1-2 mole percent) to produce an additional enhancement of red emission. The following are examples of phosphors that are efficiently excited by EM radiation emitted in the wavelength region of 300 nm to about 500 nm by polysilanes and their derivatives.

Green-emitting phosphors include $Ca_8Mg(SiO_4)_4Cl_2$: $Eu^{2+}$, $Mn^{2+}$; $GdBO_3$:$Ce^{3+}$, $Tb^{3+}$; $CeMgAl_{11}O_{19}$:$Tb^{3+}$; $Y_2SiO_5$:$Ce^{3+}$, $Tb^{3+}$; and $BaMg_2Al_{16}O_2^{-}$:$Eu^{2+}$, $Mn^{2+}$.

Red-emitting phosphors include $Y_2O_3$:$Bi^{3+}$, $Eu^{3+}$; $Sr_2P_2O_7$:$Eu^{2+}$, $Mn^{2+}$; $SrMgP_2O_7$:$Eu^{2+}$, $Mn^{2+}$; $(Y,Gd)(V,B)O_4$:$Eu^{3+}$; and $3.5MgO.0.5MgF_2.GeO_2$: $Mn^{4+}$ (magnesium fluorogermanate).

Blue-emitting phosphors include $BaMg_2Al_{16} O_{27}$:$Eu^{2+}$; $Sr_5(PO_4)_{10}Cl_2$:$Eu^{2+}$; and $(Ba,Ca,Sr)_5(PO_4)_{10} (Cl,F)_2$:$Eu^{2+}$, $(Ca,Ba,Sr) (Al,Ga)_2S_4$:$Eu^{2+}$.

Yellow-emitting phosphors include $(Ba,Ca,Sr)_5 (PO_4)_{10} (Cl,F)_2$:$Eu^{2+}$, $Mn^{2+}$.

Still other ions may be incorporated into the phosphor to transfer energy from the light emitted from the organic material to other activator ions in the phosphor host lattice as a way to increase the energy utilization. For example, when $Sb^{3+}$ and $Mn^{2+}$ ions exist in the same phosphor lattice, $Sb^{3+}$ efficiently absorbs light in the blue region, which is not absorbed very efficiently by $Mn^{2+}$, and transfers the energy to $Mn^{2+}$ ion. Thus, a larger total amount of light emitted by the organic layer 14 is absorbed by both ions, resulting in higher quantum efficiency of the total device.

The photo-luminescent material may also be an organic dye that can absorb radiation emitted by the material of the organic layer 14 and emit electromagnetic radiation in the visible spectrum.

Conventional lithographic means can be used to create the scattering layer using, for example, photo-resist, mask exposures, and etching as known in the art. Alternatively, coating may be employed in which a liquid, for example solvent having a dispersion of titanium dioxide, may form a scattering layer 22.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation.

In particular, as illustrated in FIG. 5, protective layers 26a/26b may be employed. For example, very thin layers of transparent encapsulating materials may be deposited on the electrode 16. In this case, the scattering layer 22 may be deposited over the layers of protective materials 26a. This structure has the advantage of protecting the electrode 16 during the deposition of the scattering layer 22. Preferably, the layers of transparent protective material 26a has a refractive index at least comparable to the refractive index range of the transparent electrode and organic layers, or is very thin (e.g., less than about 0.2 micron) so that waveguided light in the transparent electrode 16 and organic layers 14 will pass through the layers of transparent protective material 26a and be scattered by the scattering layer 22.

OLED devices of this invention can employ various well-known optical effects in order to enhance their properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The present invention may also be practiced with either active- or passive-matrix OLED devices. It may also be employed in display devices or in area illumination devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 1, 2, 3, 4 light rays
10 substrate
12 electrode
14 organic layer(s)
16 transparent electrode
18 gap
20 cover
22 scattering layer
23 scattering particles
26, 26a, 26b protective layer
30 transparent, high-index particles
50 light-emitting area
100 provide OLED step
105 form dispersion step
110 coat dispersion step
115 dry dispersion step

The invention claimed is:

1. An organic light-emitting diode (OLED) device, comprising:
   a light-emitting area of an OLED comprising a first electrode, a second transparent electrode, and one or more layers of organic light-emitting material formed between the electrodes; and
   a light-scattering layer, formed on a side of the transparent electrode opposite the one or more layers of organic light-emitting material, comprising transparent, light-scattering particles having a refractive index greater than or equal to 1.8 formed in a cavity, wherein the ratio of the volume of light-scattering particles to the volume of the light scattering layer is within the range of 0.55 to 0.75 over a majority of the light-emitting area.

2. The OLED device of claim 1, wherein the light-scattering particles have a relatively higher index of refraction than the average index of the remaining volume of the light-scattering layer.

3. The OLED device of claim 1, wherein the light-scattering particles are non-spherical and randomly oriented.

4. The OLED device of claim 1, wherein no layers having an index of more than 0.1 less than that of the light-emitting material layer and a thickness sufficient to trap light are formed between the scattering layer and the light emitting material layer.

5. The OLED device of claim 1, wherein the light-scattering layer is in direct optical contact with the transparent electrode.

6. The OLED device of claim 1, wherein the majority of the light-scattering layer volume that is not occupied by light-scattering particles is occupied by a gas or vacuum.

7. The OLED device of claim 1, wherein the light-scattering layer further comprises a binder having a refractive optical index less than the refractive index of the light-scattering particles and having a weight less than 10% of the weight of the light-scattering particles.

8. The OLED device of claim 1, wherein the ratio of the volume of light-scattering particles to the volume of the layer is between 0.55 and 0.65.

9. The OLED device of claim 1, further comprising one or more protective layers formed between the light-scattering layer and the transparent electrode and/or over the light-scattering layer on the side of the light-scattering layer opposite the transparent electrode.

10. The OLED device of claim 1, wherein the light-scattering particles have an average maximum diameter of less than 2 microns.

11. The OLED device of claim 10, wherein the light-scattering particles have an average maximum diameter of between one and two microns.

12. The OLED device of claim 1, wherein the light-scattering particles comprise phosphorescent or fluorescent particles.

13. The OLED device of claim 1, wherein the light-scattering layer further includes phosphorescent or fluorescent particles.

14. The OLED device of claim 13, wherein the phosphorescent or fluorescent particles have an average diameter less than or equal to 400 nm.

15. The OLED device of claim 1, wherein the OLED device is a display device.

16. The OLED device of claim 1, wherein the light-scattering particles comprise a metal oxide.

17. The OLED device of claim 1, wherein the light-scattering particles comprise one or more of the following: rutile particles, $SiO_x$ (x>1), $SiN_x$ (x>1), $Si_3N_4$, $TiO_2$, $MgO$, $ZnO$, $Al_2O_3$, $SnO_2$, $In_2O_3$, $MgF_2$, hafnia ($HfO_2$), zirconia ($ZrO_2$), zircon ($ZrO_2.SiO_2$), gadolinium gallium garnet ($Gd_3Ga_5O_{12}$), barium sulfate, yttria ($Y_2O_3$), yttrium aluminum garnet ($Y_3Al_5O_{12}$), calcite ($CaCO_3$), sapphire ($Al_2O_3$), diamond, magnesium oxide, germanium oxide, or $CaF_2$.

18. The OLED device of claim 1, wherein the light-scattering layer is less than one micrometer thick.

19. A method of forming an OLED device comprising the steps of:
   a) providing an OLED with a light-emitting area comprising a first electrode and a second transparent electrode and one or more layers of organic light-emitting material formed between the electrodes;
   b) forming a dispersion comprising an evaporable solvent and a plurality of transparent light scattering particles;
   c) coating the dispersion on a side of the transparent electrode opposite the one or more layers of organic light-emitting material; and
   d) drying the dispersion to form a light scattering layer on the transparent electrode, wherein the ratio of the volume of scattering particles to the volume of the light scattering layer is within the range of 0.55 to 0.75 over a majority of the light-emitting area.

* * * * *